(12) United States Patent
Tachibana et al.

(10) Patent No.: US 8,202,367 B2
(45) Date of Patent: Jun. 19, 2012

(54) ATOMIC LAYER GROWING APPARATUS

(75) Inventors: Hiroyuki Tachibana, Okayama (JP);
Kazutoshi Murata, Okayama (JP);
Nozomu Hattori, Okayama (JP)

(73) Assignee: Mitsui Engineering & Shipbuilding Co., Ltd., Tokyo (JP)

( * ) Notice: Subject to any disclaimer, the term of this patent is extended or adjusted under 35 U.S.C. 154(b) by 890 days.

(21) Appl. No.: 12/295,194

(22) PCT Filed: Mar. 28, 2007

(86) PCT No.: PCT/JP2007/056622
§ 371 (c)(1),
(2), (4) Date: Sep. 29, 2008

(87) PCT Pub. No.: WO2007/114156
PCT Pub. Date: Oct. 11, 2007

(65) Prior Publication Data
US 2009/0266296 A1    Oct. 29, 2009

(30) Foreign Application Priority Data
Mar. 30, 2006 (JP) ................. 2006-094466

(51) Int. Cl.
*C23C 16/54* (2006.01)
(52) U.S. Cl. ............... 118/726; 118/715; 118/633
(58) Field of Classification Search ............. 118/663,
118/715, 726, 633; 156/345, 29, 345.33,
156/345.26, 345.29
See application file for complete search history.

(56) References Cited

U.S. PATENT DOCUMENTS

| | | | | |
|---|---|---|---|---|
| 5,989,345 A | * | 11/1999 | Hatano | 118/715 |
| 2004/0124131 A1 | * | 7/2004 | Aitchison et al. | 210/252 |
| 2006/0032444 A1 | * | 2/2006 | Hara | 118/715 |
| 2009/0266296 A1 | * | 10/2009 | Tachibana et al. | 118/663 |

FOREIGN PATENT DOCUMENTS

| | | |
|---|---|---|
| JP | 05-186295 A | 7/1993 |
| JP | 11-117070 A | 4/1999 |
| JP | 2002-129337 | 5/2002 |
| JP | 2004-134466 A | 4/2004 |
| JP | 2006-052424 A | 2/2006 |

OTHER PUBLICATIONS

Machine Generated English Translation of JP 11-117070. Published Apr. 27, 1999.*

* cited by examiner

*Primary Examiner* — Sylvia R. MacArthur
(74) *Attorney, Agent, or Firm* — Blakely, Sokoloff, Taylor & Zafman

(57) ABSTRACT

An atomic layer growing apparatus includes a film forming chamber (101) in which the vapor phase growth of a film is performed, a substrate table (102) having a heating mechanism accommodated in the film forming chamber (101), and an exhaust mechanism (104). The atomic layer growing apparatus also includes a material supply unit (105) including a material vaporizer (151), two buffer tanks, i.e., a buffer tank A (152*a*) and buffer tank B (152*b*), a fill valve A (153*a*) and supply valve A (154*a*) of the buffer tank A (152*a*), a fill valve B (153*b*) and supply valve B (154*b*) of the buffer tank B (152*b*), an injection control valve (155), and a control unit (156) which controls the opening/closing of each valve.

4 Claims, 4 Drawing Sheets

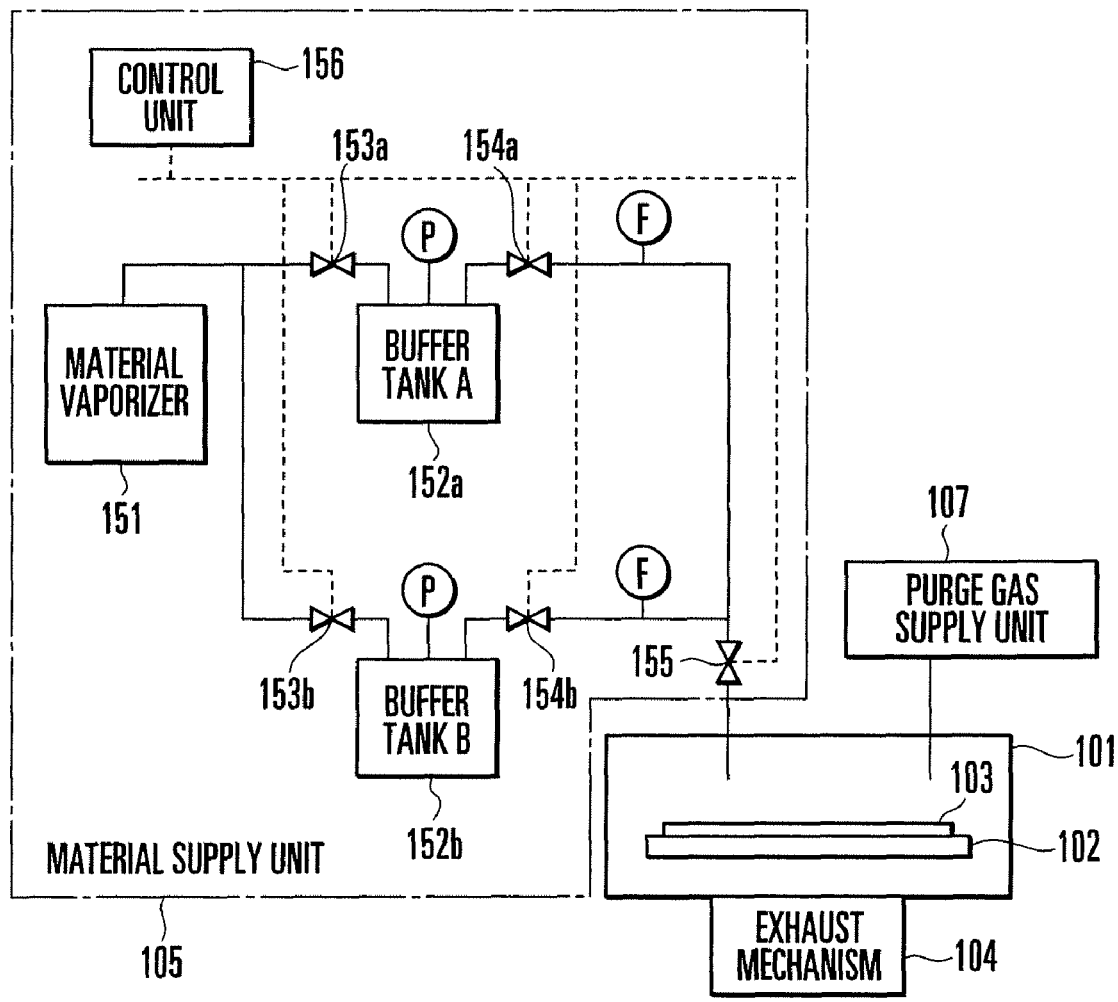
F I G . 1

ATOMIC LAYER GROWING APPARATUS

This is a non-provisional application claiming the benefit of International application number PCT/JP2007/056622 filed Mar. 28, 2007.

TECHNICAL FIELD

The present invention relates to an atomic layer growing apparatus which can form a thin film by depositing atomic layers and molecular layers one after another and, more particularly, to an atomic layer growing apparatus which can supply a source gas while the pressure, for example, is stable.

BACKGROUND ART

In recent years, atomic layer deposition (ALD) is used as a technique of forming a uniform thin film on a substrate having a large area with a good reproducibility (patent reference 1: Japanese Patent Laid-Open No. 05-186295). The atomic layer deposition is a technique of forming a thin film by depositing atomic layers one after another by alternately supplying materials of respective elements composing a film to be formed. In the atomic layer deposition, one or n layers alone are adsorbed onto the substrate surface while supplying the materials of the respective elements so that no surplus materials contribute to the deposition. This is called the self-limiting deposition. Since the atomic layer deposition uses no plasma, it can form a high-quality film. Still better, since the processing temperature need only be set as low as, e.g., about 300° C. in the atomic layer deposition, an insulating film can be formed even on a glass substrate. Hence, the atomic layer deposition has a feature that it can be applied widely.

An atomic layer growing apparatus to practice the atomic layer deposition having the above-described feature includes a film forming chamber 301 in which the vapor phase growth of a film is performed, a substrate table 302 having a heating mechanism accommodated in the film forming chamber 301, and an exhaust mechanism 304, as shown in FIG. 3. The atomic layer growing apparatus also includes a material supply mechanism 305 including a source gas vaporizer 351 and buffer tank 352, and a purge gas supply unit 307.

In the apparatus shown in FIG. 3, a substrate 303 to be processed is loaded onto the substrate table 302, and the film forming chamber 301 is sealed. After that, while the substrate 303 is heated to a predetermined temperature by the heating mechanism of the substrate table 302, the supply of a predetermined gas by the material supply mechanism 305, the evacuation of the chamber 301 by the exhaust mechanism 304, the purge of the surplus gas by supplying a purge gas by the purge gas supply unit 307, and the evacuation of the chamber 301 by the exhaust mechanism 304 are repeated, thereby forming a desired thin film.

A material (organometallic material) used in the formation of an insulating film by the atomic layer growing apparatus is in the liquid phase at an atmospheric pressure of about 20° C. For this reason, the material supply mechanism 305 vaporizes the material in the liquid phase by the source gas vaporizer 351, and supplies the vaporized material into the film forming chamber 301. Also, the material supply mechanism 305 supplies a source gas into the film forming chamber 301 while a variation in pressure, for example, is suppressed by using the buffer tank 352. At the stage of supplying the source gas into the film forming chamber 301, a supply valve 354 of the film forming chamber 301 is opened while a fill valve 353 of the buffer tank 352 is closed. This control can suppress a variation in pressure caused when the source gas from the source gas vaporizer 351 flows directly.

DISCLOSURE OF INVENTION

Problem to be Solved by the Invention

However, amid the prevalence of the execution of the atomic layer deposition at a shorter cycle by shortening the purge time and exhaust time, the above-described prior art cannot make the most of the capacity of the source gas vaporizer 351 to supply the source gas, as will be described later, so the supply of the source gas often runs short.

In the source gas supply, first, the buffer tank 352 is filled with a source gas generated by the source gas vaporizer 351 while the supply valve 354 is closed and the fill valve 353 is open. Next, the fill valve 353 is closed and the supply valve 354 is opened to supply the source gas by the buffer tank 352. Therefore, the source gas cannot be supplied into the film forming chamber 301 while the buffer tank 352 is filled with the source gas. Note that when the buffer tank 352 is filled with the source gas while the supply of the source gas is stopped in each cycle of the atomic layer deposition, it is possible to stably supply the source gas into the film forming chamber 301 at a given stage as needed.

However, as described above, when the atomic layer deposition is performed at a shorter cycle, the time for which the supply of the source gas is stopped is shortened, so the source gas supply process starts at a stage before the buffer tank 352 is completely filled with the source gas. In this state, the source gas is not always supplied throughout the source gas supply process. In this manner, the conventional apparatus shown in FIG. 3 often cannot stably supply the source gas when each cycle of the atomic layer deposition is shortened.

The present invention has been made to solve the above-described problem, and has as its object to make it possible to stably supply the source gas even when the source gas supply process in the atomic layer deposition is shortened.

Means of Solution to the Problem

An atomic layer growing apparatus according to the present invention comprises at least a film forming chamber having an internal space which can be sealed, material vaporizing means for generating a source gas by vaporizing a material, a plurality of buffer tanks filled with a source gas generated by the material vaporizing means, fill valves which are respectively attached to the buffer tanks and control the filling of the source gas generated by the material vaporizing means, supply valves which respectively control the supply of a source gas from the buffer tanks, and control means for controlling opening/closing of the fill valves and the supply valves, wherein the control means performs control so that while the source gas is supplied into the film forming chamber by opening the supply valve of at least one of the buffer tanks, other buffer tanks the supply valves of which are not open are filled with a source gas by opening the fill valves of the other tanks.

This apparatus can always supply the source gas into the film forming chamber while the source vaporizing means and the film forming chamber never communicate with each other.

In the above-described atomic layer growing apparatus, the control means may control to supply the source gas into the film forming chamber by closing a supply valve of the buffer tank filled with a source gas by opening a fill valve of the buffer tank, and by opening a supply valve of a buffer tank filled with the source gas in excess of a prescribed lower limit.

Also, the above-described atomic layer growing apparatus may further comprise an injection control valve which controls injection of a source gas supplied from the buffer tanks into the film forming chamber, wherein the control means performs control so that while the source gas is supplied into the film forming chamber by opening the injection control valve and the supply valve of at least one of the buffer tanks, other buffer tanks the supply valves of which are not open are filled with a source gas by opening the fill valves of the other buffer tanks. In this case, the control means preferably controls to open the injection control valve while a supply valve of a buffer tank filled with a source gas by opening a fill valve of the buffer tank is closed, and a supply valve of a buffer tank filled with a source gas in excess of a prescribed lower limit is open. In this apparatus, the pressure of the source gas which fills the buffer tank which supplies the source gas into the film forming chamber always exceeds the prescribed lower limit of its internal pressure while the source vaporizing means and the film forming chamber never communicate with each other.

Effects of the Invention

As has been described above, according to the present invention, a plurality of buffer tanks are used so that, for example, the injection control valve is opened while the supply valve of a buffer tank filled with the source gas by opening its fill valve is closed, and the supply valve of a buffer tank filled with the source gas in excess of the prescribed lower limit of its internal pressure is open. That is, a plurality of buffer tanks are used so that while the source gas is supplied into the film forming chamber by opening the supply valve of at least one buffer tank, other buffer tanks the supply valves of which are not open are filled with the source gas by opening the fill valves of the other buffer tanks. This produces an excellent effect of more stably supplying the source gas into the film forming chamber even when the time for the source gas supply process in the atomic layer growth is shortened.

BRIEF DESCRIPTION OF DRAWINGS

FIG. 1 is a block diagram showing an example of the arrangement of an atomic layer growing apparatus according to an embodiment of the present invention;

BEST MODE FOR CARRYING OUT THE INVENTION

Figure 2:
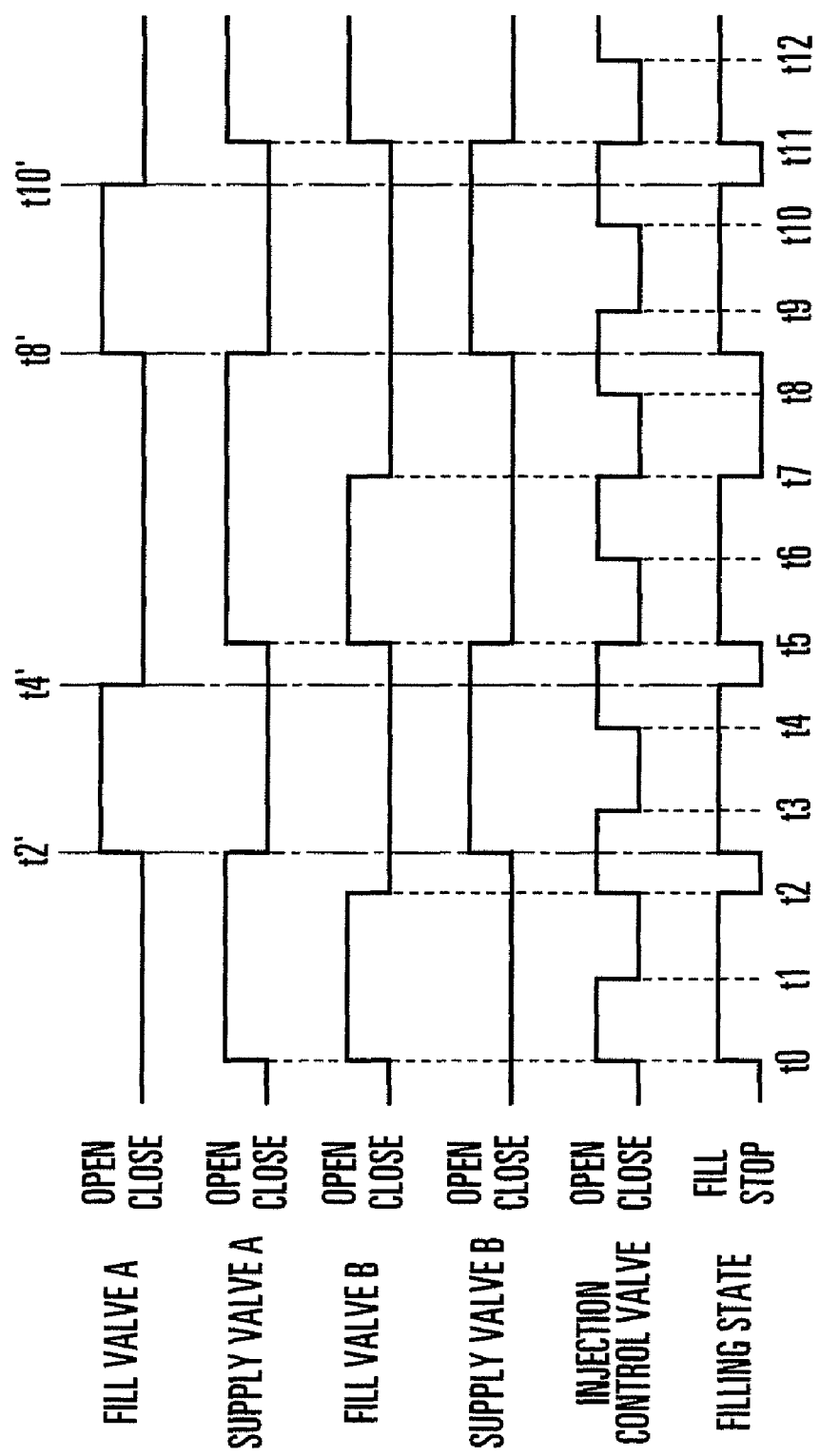
FIG. 2 is a timing chart showing an example of the control of each valve by a control unit 156 shown in FIG. 1.
Figure 3:
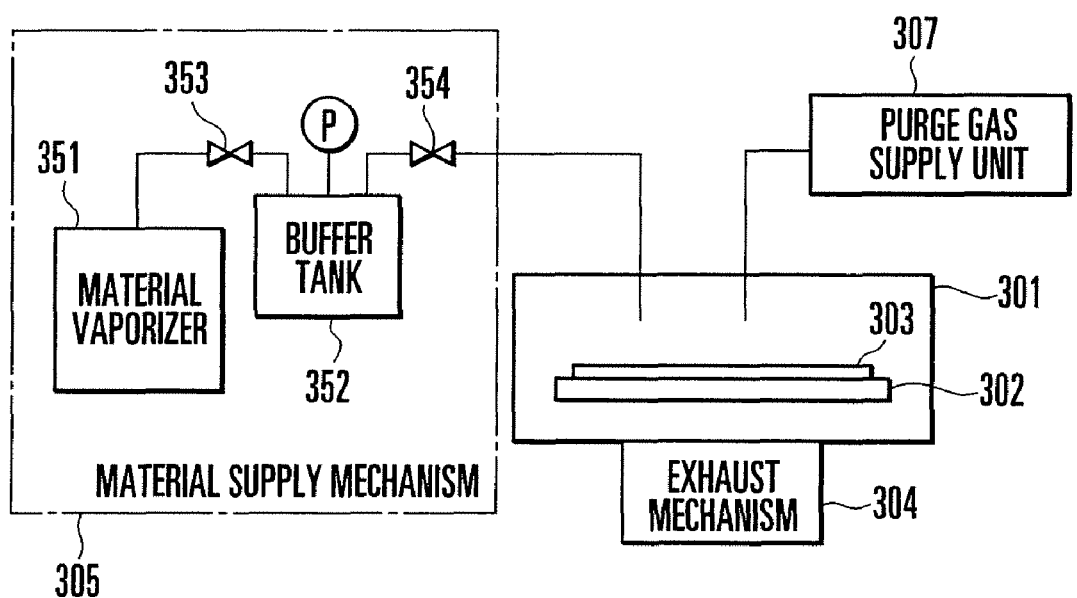
FIG. 3 is a block diagram showing an example of the arrangement of the conventional atomic layer growing apparatus.

An embodiment of the present invention will be described below with reference to the accompanying drawings. FIG. 1 is a block diagram showing an example of the arrangement of an atomic layer growing apparatus according to the embodiment of the present invention. First, the atomic layer growing apparatus according to this embodiment shown in FIG. 1 includes a film forming chamber 101 in which the vapor phase growth of a film is performed, a substrate table 102 having a heating mechanism accommodated in the film forming chamber 101, and an exhaust mechanism 104. The film forming chamber 101 has an internal space which can be sealed, and accommodates the substrate table 102 in it. The atomic layer growing apparatus also includes a material supply unit 105 including a material vaporizer 151, two buffer banks, i.e., a buffer bank A 152a and buffer bank B 152b, a fill valve A 153a and supply valve A 154a of the buffer tank A 152a, a fill valve B 153b and supply valve B 154b of the buffer tank B 152b, an injection control valve 155, and a control unit 156 which controls the opening/closing of each valve. The atomic layer growing apparatus according to this embodiment also includes a purge gas supply unit 107 which supplies a purge gas formed from an inert gas such as argon or nitrogen into the film forming chamber 101.

The material vaporizer 151 accommodates an organometallic material such as aminosilane, and vaporizes the accommodated organometallic material by heating to generate a source gas. The source gas generated in this way fills the buffer tank A 152a and buffer tank B 152b first. After that, the source gas which fills the buffer tank A 152a and that which fills the buffer tank B 152b are alternately supplied into the film forming chamber 101. The filling of the source gas into the buffer tanks, and the supply of the source gas from the buffer tanks are controlled by controlling the opening/closing of the fill valve A 153a, supply valve A 154a, fill valve B 153b, supply valve B 154b, and injection control valve 155 by the control unit 156.

An example of the control of each valve by the control unit 156 and an example of the source gas supply operation will be explained below with reference to the block diagram shown in FIG. 1 and the timing chart shown in FIG. 2. At the initial stage, the buffer tank A 152a is filled with the source gas. In this state, the control unit 156 keeps all of the fill valve A 153a, supply valve A 154a, fill valve B 153b, supply valve B 154b, and injection control valve 155 closed. When the source gas supply process in the atomic layer deposition starts at time t0 in this state, the control unit 156 opens the supply valve A 154a and injection control valve 155 to supply the source gas from the buffer tank A 152a into the film forming chamber 101. At the same time, the control unit 156 opens the fill valve B 153b to fill the buffer tank B 152b with the source gas.

When time t1 at which the source gas supply process ends and the purge process starts comes, the control unit 156 closes the injection control valve 155. When time t2 at which the purge process ends and the next material gas supply process starts comes, the control unit 156 opens the injection control valve 155. Also at time t2, when the pressure of the source gas which fills the buffer tank B 152b reaches its specific upper limit, the control unit 156 closes the fill valve B 153b. At time t2' in this material gas supply process, the pressure of the source gas in the buffer tank A 152a becomes lower than its prescribed lower limit, so the control unit 156 closes the supply valve A 154a and opens the fill valve A 153a and supply valve B 154b. With this operation, the source gas is supplied from the buffer tank B 152b into the film forming chamber 101.

When time t3 at which the source gas supply process ends and the purge process starts comes, the control unit 156 closes the injection control valve 155. When time t4 at which the purge process ends and the next material supply process starts comes, the control unit 156 opens the injection control valve 155. At time t4' in this source gas supply process, when the pressure of the source gas which fills the buffer tank A 152a reaches its specific upper limit, the control unit 156 closes the fill valve A 153a. When time t5 at which the source gas supply process ends and the purge process starts comes, the control unit 156 closes the injection control valve 155. At time t5, the pressure of the source gas in the buffer tank B 152b becomes lower than its prescribed lower limit, so the control unit 156 closes the supply valve B 154b and opens the fill valve B 153b and supply valve A 154a.

When time t6 at which the purge process ends and the next material supply process starts comes, the control unit 156 opens the injection control valve 155. With this operation, the source gas is supplied from the buffer tank A 152a into the film forming chamber 101. When time t7 at which the source gas supply process ends and the purge process starts comes, the control unit 156 closes the injection control valve 155.

When time t8 at which the purge process ends and the next material supply process starts comes, the control unit 156 opens the injection control valve 155. At time t8' in this material supply process, the pressure of the source gas in the buffer tank A 152a becomes lower than its prescribed lower limit, so the control unit 156 closes the supply valve A 154a and opens the fill valve A 153a and supply valve B 154b. With this operation, the source gas is supplied from the buffer tank B 152b into the film forming chamber 101.

When time t9 at which the source gas supply process ends and the purge process starts comes, the control unit 156 closes the injection control valve 155. When time t10 at which the purge process ends and the next material supply process starts comes, the control unit 156 opens the injection control valve 155. At time t10' in this material supply process, when the pressure of the source gas which fills the buffer tank A 152a reaches its specific upper limit, the control unit 156 closes the fill valve A 153a.

When time t11 at which the source gas supply process ends and the purge process starts comes, the control unit 156 closes the injection control valve 155. Also at time t11, the pressure of the source gas in the buffer tank B 152b becomes lower than its prescribed lower limit, so the control unit 156 closes the supply valve B 154b and opens the fill valve B 153b and supply valve A 154a. When time t12 at which the purge process ends and the next material supply process starts comes, the control unit 156 opens the injection control valve 155. With this operation, the source gas is supplied from the buffer tank A 152a into the film forming chamber 101. Note that the pressure of the source gas described above need only be measured by a manometer P built in each buffer tank.

In the atomic layer growing apparatus according to this embodiment, a substrate 103 to be processed is loaded onto the substrate table 102, and the film forming chamber 101 is sealed. After that, while the substrate 103 is heated to a predetermined temperature by the heating mechanism of the substrate table 102, the above-described source gas supply process and the above-described purge process including the supply of the purge gas by the purge gas supply unit 107 and the evacuation of the chamber 101 by the exhaust mechanism 104 are repeated, thereby forming a desired thin film.

As has been described above, the atomic layer growing apparatus according to this embodiment shown in FIG. 1 uses two buffer tanks so that the source gas is supplied into the film forming chamber by opening the supply valve of one buffer tank, and the other buffer tank is filled with the source gas by opening the fill valve of the other buffer tank. For example, this apparatus uses two buffer tanks so that the injection control valve is opened while the supply valve of a buffer tank filled with the source gas by opening its fill valve is closed, and the supply valve of a buffer tank filled with the source gas in excess of the prescribed lower limit of its internal pressure is open. The opening/closing of each valve is controlled by the control unit (control means).

Consequently, the material vaporizer 151 and film forming chamber 101 never communicate with each other in all the states. This suppresses a variation in pressure caused when the source gas from the material vaporizer 151 flows directly. Also, the pressure of the source gas which fills a buffer tank which supplies the source gas into the film forming chamber 101 can always exceed its prescribed lower limit. For this reason, even when the atomic layer deposition is performed at a cycle shorter than the time for which one buffer tank is filled with the source gas, the source gas is always supplied into the film forming chamber 101 in the source gas supply process, as shown in the timing chart of FIG. 2. Also, the source gas is supplied into the film forming chamber 101 always at a stable pressure.

As described above, the use of two buffer tanks allows suppression of wasting of the capacity of the material vaporizer 151 to generate a source gas. When one buffer tank supplies the source gas, the filling of the source gas is stopped while the source gas is supplied. Accordingly, in the example shown in FIG. 2, the generation capacity of the material vaporizer 151 is wasted during the material supply process, which accounts for half the overall process. In contrast, when two buffer tanks supply the source gas, the time for which the filling of the source gas is stopped becomes shorter than the time for the material supply process, as indicated by "Filling State" shown in FIG. 2. This suppresses wasting of the capacity of the material vaporizer 151 to generate a source gas.

The above description has been given assuming that even at the stage where the material supply process is not performed (while the injection control valve 155 is closed), when the pressure of the source gas in one buffer tank becomes lower than its prescribed lower limit, the supply valve of the other buffer tank is opened to supply the source gas up to the injection control valve 155. For example, the injection control valve 155 is closed and the supply valve A 154a is opened at time t5. However, the present invention is not particularly limited to this, and the injection control valve 155 and supply valve A 154a may be opened at time t6. Note that a variation in pressure in the source gas supply can be further suppressed by performing the control shown in FIG. 2 by taking account of a delay of the source gas supply due to the presence of the capacity of the pipe from the supply valve to the injection control valve 155.

Also in the above-described method, when the pressure in a buffer tank becomes lower than its prescribed lower limit while the material supply process is performed (while the injection control valve 155 is open), the supply valve of this buffer tank is closed and its fill valve is opened, and the supply valve of the other buffer tank is opened at the same time. For example, at time t2', the pressure in the buffer tank A 152a becomes lower than its prescribed lower limit while the injection control valve 155 is open, so the supply valve A 154a is closed and the fill valve A 153a and supply valve B 154b are opened at the same time.

However, the present invention is not particularly limited to this, and the two supply valves may be alternately opened/closed at the timing at which the injection control valve opens. For example, first, at time t0, the injection control valve 155 and supply valve A 154a are opened at the same time. Next, at time t2 at which the injection control valve 155 is opened, the supply valve A 154a is closed and the supply valve B 154b is opened at the same time. Lastly, at time t4 at which the injection control valve 155 is opened, the supply valve B 154b is closed and the supply valve A 154a is opened at the same time. Control is performed to repeat these operations. The fill valve A 153a and fill valve B 153b are controlled to open when the corresponding supply valve A 154a and supply valve B 154b are closed, and they are controlled to close when the pressures in the corresponding buffer tanks reach their specific upper limits.

Figure 4:
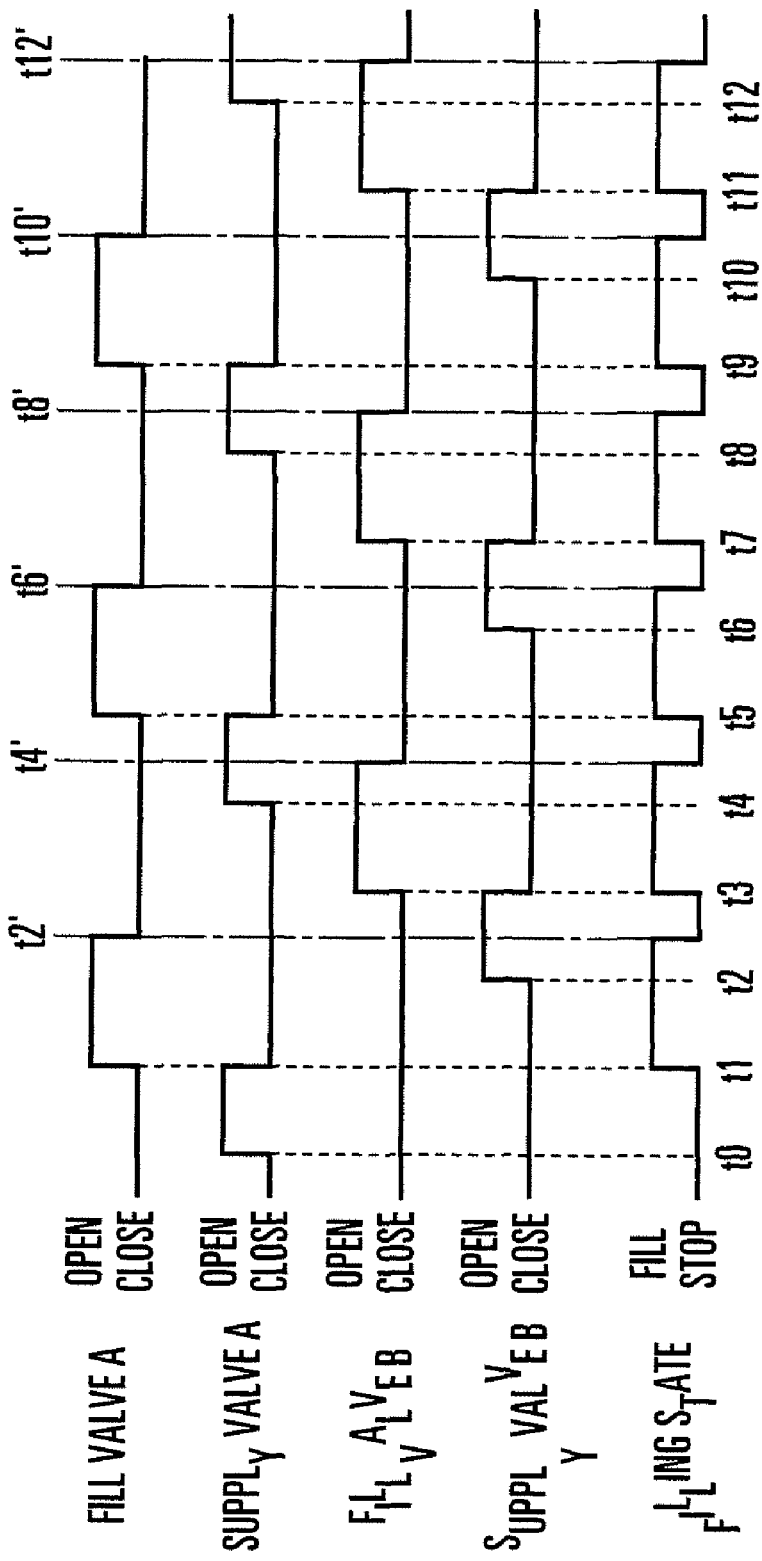
FIG. 4 is a timing chart showing another example of the control of each valve by the control unit 156 shown in FIG. 1.

The source gas may be supplied into the film forming chamber by controlling the supply valve attached to each buffer tank without using the injection control valve. For example, the control of each valve need only be performed as shown in the timing chart of FIG. 4. This control will be explained. In this example, first, the injection control valve 155 is opened at all the stages (times). At the initial stage, the buffer tank A 152a is filled with the source gas. In this state, the control unit 156 closes the fill valve A 153a, supply valve A 154a, fill valve B 153b, and supply valve B 154b. When the source gas supply process in the atomic layer deposition starts at time t0 in this state, the control unit 156 opens the supply valve A 154a to supply the source gas from the buffer tank A 152a into the film forming chamber 101.

When time t1 at which the source gas supply process ends and the purge process starts comes, the control unit 156 closes the supply valve A 154a to stop the source gas supply, and opens the fill valve A 153a to fill the buffer tank A 152a with the source gas. When time t2 at which the purge process ends and the next material supply process starts comes, the control unit 156 opens the supply valve B 154b to supply the source gas from the buffer tank B 152b into the film forming chamber 101. At time t2' in this material supply process, when the pressure of the source gas which fills the buffer tank A 152a reaches its specific upper limit, the control unit 156 closes the fill valve A 153a.

When time t3 at which the source gas supply process ends and the purge process starts comes, the control unit 156 closes the supply valve B 154b to stop the source gas supply, and opens the fill valve B 153b to fill the buffer tank B 152b with the source gas. When time t4 at which the purge process ends and the next material supply process starts comes, the control unit 156 opens the supply valve A 154a to supply the source gas from the buffer tank A 152a into the film forming chamber 101. At time t4' in this material supply process, when the pressure of the source gas which fills the buffer tank B 152b reaches its specific upper limit, the control unit 156 closes the fill valve B 153b.

When time t5 at which the source gas supply process ends and the purge process starts comes, the control unit 156 closes the supply valve A 154a to stop the source gas supply, and opens the fill valve A 153a to fill the buffer tank A 152a with the source gas. When time t6 at which the purge process ends and the next material supply process starts comes, the control unit 156 opens the supply valve B 154b to supply the source gas from the buffer tank B 152b into the film forming chamber 101. At time t6' in this material supply process, when the pressure of the source gas which fills the buffer tank A 152a reaches its specific upper limit, the control unit 156 closes the fill valve A 153a.

When time t7 at which the source gas supply process ends and the purge process starts comes, the control unit 156 closes the supply valve B 154b to stop the source gas supply, and opens the fill valve B 153b to fill the buffer tank B 152b with the source gas. After that, the above-described operation is repeated at times t8, t8', t9, t10, t10', t11, t12, t12', . . . . Note that the pressure of the source gas described above need only be measured by the manometer P built in each buffer bank.

Even in the above-described control, the material vaporizer 151 and film forming chamber 101 never communicate with each other. This suppresses a variation in pressure caused when the source gas from the material vaporizer 151 flows directly. Also even in this control, the period from time t1 to time t2' is taken for the filling, and the atomic layer deposition (source gas supply) is performed at a period (cycle) shorter than that period. Nevertheless, the source gas is always supplied into the film forming chamber 101 in the source gas supply process, as shown in the timing chart of FIG. 4. Also, the source gas is supplied into the film forming chamber 101 always at a stable pressure.

Although the above description has been given assuming that it is confirmed that the pressure of the source gas which fills each buffer bank exceeds its prescribed lower limit using the pressure value measured by the manometer P built in the buffer tank, and the supply valve of the buffer tank is opened to supply the source gas into the film forming chamber, the present invention is not particularly limited to this. As shown in FIG. 1, the flow rate of the source gas supplied from each supply valve may be measured by a flowmeter F, and the opening/closing of the supply valve of each buffer tank may be controlled on the basis of the measurement result of the flow rate, e.g., by confirming whether the flow rate measured exceeds a predetermined value.

Although the above description has been given assuming that two buffer tanks are used, the present invention is not particularly limited to this, and three or more buffer tanks may be used. Even when three or more buffer tanks are used, first, each buffer tank used need only include a fill valve which controls the filling of a source gas generated by a material vaporizer (material vaporizing means), and a supply valve which controls the supply of the source gas from the buffer tank. In addition, control need only be performed so that the injection control valve is opened while the supply valve of a buffer tank which fills the source gas by closing its fill valve is closed, and the supply valve of a buffer tank filled with the source gas in excess of the prescribed lower limit of its internal pressure is open. With this operation, even when the operation in each cycle is performed at a shorter interval, either buffer tank always supplies the material gas in the material supply process.

The atomic layer growing apparatus according to this embodiment shown in FIG. 1 is also applicable to atomic layer deposition which forms a metal oxide film using an oxidizing gas such as oxygen or ozone, in addition to that which uses a source gas containing an organometallic material. For example, repeating organometallic source gas supply process→purge process→oxidizing gas supply process→purge process→ . . . makes it possible to form a metal oxide film. Even in this case, supplying, in turn, a source gas using a plurality of buffer tanks allows more stable source gas supply even when the time for the gas supply process is shortened.

INDUSTRIAL APPLICABILITY

The present invention is preferably adopted in the crystal growth of a thin film made of a semiconductor or compound semiconductor, and the formation of, e.g., an oxide film.

The invention claimed is:

1. An atomic layer growing apparatus comprising:
a film forming chamber having an internal space which can be sealed;
a single material vaporizer configured to generate a source gas by vaporizing a material;
a plurality of buffer tanks which are connected in parallel and filled with the source gas generated by said material vaporizer;
fill valves which are respectively attached to said buffer tanks and control the filling of the source gas generated by said material vaporizer;
supply valves which respectively control the supply of the source gas from said buffer tanks; and
control unit configured to control opening/closing of said fill valves and said supply valves, wherein said control unit performs said opening/closing so that while the source gas is supplied into said film forming chamber by opening said supply valve of at least one of said buffer tanks, other buffer tanks having supply valves which are not open are filled with the source gas by opening said fill valves of said other tanks.

2. An atomic layer growing apparatus according to claim 1, wherein said control unit supplies the source gas into said film forming chamber by closing a supply valve of said buffer tank filled with the source gas by opening a fill valve of said buffer tank, and by opening a supply valve of a buffer tank filled with the source gas in excess of a prescribed lower limit.

3. An atomic layer growing apparatus according to claim 1, further comprising:
an injection control valve which controls injection of a the source gas supplied from said buffer tanks into said film forming chamber,
wherein said control unit operates so that while the source gas is supplied into said film forming chamber by opening said injection control valve and said supply valve of at least one of said buffer tanks, other buffer tanks having supply valves which are not open are filled with the source gas by opening said fill valves of said other buffer tanks.

4. An atomic layer growing apparatus according to claim 3, wherein said control unit opens said injection control valve while a supply valve of said buffer tank filled with the source gas by opening a fill valve of said buffer tank is closed, and said supply valve of a buffer tank filled with the source gas in excess of a prescribed lower limit is open.

* * * * *